United States Patent
Feiweier et al.

(10) Patent No.: US 10,288,709 B2
(45) Date of Patent: May 14, 2019

(54) MEDICAL IMAGING EXAMINATION APPARATUS HAVING MULTIPLE SUB-SYSTEMS AND METHOD FOR THE OPERATION THEREOF

(71) Applicant: SIEMENS HEALTHCARE GMBH, Erlangen (DE)

(72) Inventors: Thorsten Feiweier, Poxdorf (DE); Michael Koehler, Nuremberg (DE); Daniel Niederloehner, Erlangen (DE); Michael Wullenweber, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 116 days.

(21) Appl. No.: 15/378,409

(22) Filed: Dec. 14, 2016

(65) Prior Publication Data

US 2017/0168128 A1    Jun. 15, 2017

(30) Foreign Application Priority Data

Dec. 14, 2015   (DE) .................... 10 2015 225 080

(51) Int. Cl.
*G01R 33/44*    (2006.01)
*G01R 33/54*    (2006.01)
*G01R 33/3875*  (2006.01)

(52) U.S. Cl.
CPC ....... *G01R 33/543* (2013.01); *G01R 33/3875* (2013.01); *G01R 33/443* (2013.01)

(58) Field of Classification Search
CPC .. A61B 5/055; G01R 33/543; G01R 33/3875; G01R 33/4835; G01R 33/5607;

(Continued)

(56) References Cited

U.S. PATENT DOCUMENTS

2008/0088307 A1*  4/2008  Dewdney ........... G01R 33/3875
                                              324/309
2010/0286802 A1*  11/2010  Feiweier ................ G01R 33/54
                                              700/90

(Continued)

OTHER PUBLICATIONS

Balteau et al.: "Improved shimming for fMRI specifically optimizing the local BOLD sensitivity"; Elsevier; NeuroImage, vol. 49, pp. 327-336.—(2010).

(Continued)

*Primary Examiner* — Susan S Lee
(74) *Attorney, Agent, or Firm* — Schiff Hardin LLP (57) ABSTRACT

In a method for operating a medical imaging apparatus having multiple sub-systems controlled by a controller in a coordinated manner in order to perform a measurement sequence, a number of first setting parameters are chosen to be constant for a complete measurement sequence, and after a static adjustment, a dynamic adjustment of second setting parameters, which are defined by control signals for the measurement sequence and that can vary while a measurement sequence is being performed, takes place. Base data defining underlying conditions specific to the patient to be imaged are measured for the total imaging volume in a measurement sequence. Reference values for the setting parameters that affect the underlying conditions are saved in association with the base data during the measurement sequence. If the present values of the setting parameters adjusted during the static adjustment differ from the reference values, updated base data are calculated based on the difference between the present values and the reference values, and the current base data are used for local optimization in the dynamic adjustment.

9 Claims, 2 Drawing Sheets

(58) Field of Classification Search
CPC ............ G01R 33/4838; G01R 33/4833; G01R 33/54; G01R 33/546; G01R 33/56527; G01R 33/34046; G01R 33/385; G01R 33/443

See application file for complete search history.

(56) References Cited

U.S. PATENT DOCUMENTS

| | | | |
|---|---|---|---|
| 2016/0091586 A1* | 3/2016 | Benner ................. | G01R 33/543 324/322 |
| 2016/0091587 A1* | 3/2016 | Benner ................. | G01R 33/543 324/322 |
| 2016/0091588 A1* | 3/2016 | Benner ................. | G01R 33/543 324/309 |
| 2016/0091589 A1* | 3/2016 | Benner ................. | G01R 33/543 324/322 |
| 2016/0091590 A1* | 3/2016 | Benner ............ | G01R 33/56527 324/309 |
| 2016/0274202 A1* | 9/2016 | Stemmer ................. | A61B 5/055 |
| 2016/0274205 A1* | 9/2016 | Stemmer .............. | G01R 33/543 |

OTHER PUBLICATIONS

De Graaf et al. "Dynamic Shim Updating (DSU) for Multi-Slice Signal Acquisition", Proc. Intl. Soc. Mag. Reson. Med. vol. 10, (2002).

\* cited by examiner

MEDICAL IMAGING EXAMINATION APPARATUS HAVING MULTIPLE SUB-SYSTEMS AND METHOD FOR THE OPERATION THEREOF

BACKGROUND OF THE INVENTION

Field of the Invention

The invention concerns a method for operating a medical imaging examination apparatus having multiple sub-systems, as well as such a medical imaging apparatus and an electronically readable data storage medium that implement such a method.

Description of the Prior Art and Related Subject Matter

Medical imaging examination apparatuses such as a magnetic resonance apparatus or computed tomography apparatus, for instance, are complex equipment having a multiplicity of technical sub-systems. These include, for example for a magnetic resonance apparatus, a basic magnetic field system, a gradient system, a shim system, an RF transmit system and an RF reception system.

In order to use a magnetic resonance apparatus to generate images or spectroscopic data from a subject under examination, the subject under examination is placed in a strong homogeneous basic magnetic field, also called the B0 field, which is generated by the basic magnetic field system and has a field strength of 0.2 Tesla to 7 Tesla and higher, with the result that the nuclear spins of the subject are oriented along the basic magnetic field. In order to induce nuclear spin resonances, the subject under examination is exposed to radio frequency excitation signals (RF pulses) by suitable antenna devices in the RF transmit system, causing the nuclear spins of certain atoms, which have been excited to resonance by this RF field, to be tilted by a particular flip angle with respect to the magnetic field lines of the basic magnetic field. The induced nuclear spin resonances, i.e. the RF signals (also known as the magnetic resonance signals) emitted during precession of the nuclear spins, are detected by the RF reception system, usually digitized, and stored as complex numbers, normally (when there is a spatial reference) in a memory in a data set called a k-space matrix, (k-space data). For single-voxel spectroscopy measurements (without a spatial reference), the digitized data are stored as complex time signals, also known as "FID data". The k-space data or FID data can be used as the basis for reconstructing MR images or determining spectroscopy data. Magnetic gradient fields, rapidly switched by the gradient system, are superimposed on the basic magnetic field for spatial encoding of the measurement data. The shim system is used to make the magnetic fields homogeneous.

All these technical modules must be suitably addressed in a coordinated manner by a computerized control system. The control system must also make the settings and switching operations needed for a specific imaging process for each of the subsystems, each at the correct time. Usually data from the volume to be imaged are acquired in an imaging procedure in sub-volumes, for instance in a number of slices for 2D imaging or in a number of slabs for 3D imaging. The sub-volumes captured in this way are then combined to form a total volume. Sub-volumes may also be defined, for example, by "Regions of Interest" (ROI) or "Volumes of Interest" (VOI), which can be defined specifically by the operator. Moreover, defining local saturation regions or local preparation or labeling pulses in magnetic resonance systems results in additional sub-volumes.

As already mentioned, sequence control data, usually based on what is known as a measurement protocol, are passed to the controller for coordinated control. The sequence control data define various functional sub-sequences of a complete measurement sequence. For a magnetic resonance acquisition, a first sub-sequence may be, for example, a pulse sequence for achieving saturation locally in a specific region. Further sub-sequences may contain, for instance, specific preparation pulses, and yet further sub-sequences are used for successive excitation and for receiving the magnetic resonance signals in different slices or slabs.

Standard magnetic-resonance based techniques such as tomographic imaging (MRT, magnetic resonance tomography) or spectroscopy (MRS, magnetic resonance spectroscopy) need "benign" underlying physical conditions to ensure an optimum quality of the acquired data. For instance, these conditions concern the spatial homogeneity, temporal stability and the absolute accuracy of the relevant magnetic fields and RF fields, i.e. of the basic magnetic field (B0) and of the gradient fields ($\Delta B$) and RF fields (B1).

At present, differences from ideal underlying conditions can be corrected at least in part by system-specific corrections known as "tune-ups", in particular with regard to eddy-current induced dynamic field disturbances or gradient sensitivities, or by corrections specific to the subject under examination, known as adjustments, in particular with regard to susceptibility-related static field disturbances or spatial variations in the RF field. These corrections, however, which are established before starting a measurement, usually apply throughout the measurement ("static" adjustment).

For spatially variable underlying conditions, which cannot be fully corrected, this means a compromise for data quality.

De Graaf et al. describes in "Dynamic shim updating (DSU) for multislice signal acquisition", Proc. Intl. Soc. Mag. Reson. Med. 10, p. 536, 2002, a rudimentary form of dynamic adjustment of the shim currents in the field coils for the B0-shim in functional multislice MR imaging. For this purpose, a dedicated field determination sequence is employed for determining first-order or higher-order spatial field variations. Such a sequence must be exactly adapted to the relevant parameters (e.g. slice positions and orientations) of the desired imaging sequence. The field determination sequence acquires the data needed for determining the field, and analyzes such data in order to calculate therefrom optimized shim currents (of first order or higher) for each slice to be acquired using the imaging sequence. Then the imaging sequence containing the optimized shim currents is started. In this process, the user must pay very close attention to consistency between imaging sequence and field determination sequence in order to prevent inconsistencies resulting in poorer image quality. Thus a field determination sequence must be created anew for every imaging sequence and for every change to such a sequence, and this sequence must be run before the measurement with the imaging sequence. This method is thus very complex for the user and difficult to combine with other e.g. static adjustments, because interactions between different parameters cannot be taken into account or only taken into account to a limited extent. If statically adjusted parameters are changed, this can have implications for the optimum dynamic adjustments of the shim currents and it would be necessary to run the field determination sequence again and to recalculate the optimized shim currents. Furthermore, optimization is limited in such a conventional procedure to slices in the imaging sequence. The method does not consider smaller volumes, e.g. regional saturation volumes.

DE 10 2009 020 661 B4 describes a method that is used to adapt setting parameters of a measurement sequence, e.g. in magnetic resonance technology, while the measurement sequence is running. This document also notes that different functional sub-sequences are normally assigned different effective volumes, which means that a different sub-volume of the total measurement volume is relevant for each sub-sequence. Control signals defining optimized setting parameters are determined for each sub-sequence and each effective volume and used for dynamic control. This approach is developed by the methods described in DE 10 2014 219 778.3, DE 10 2014 219 785.6, DE 10 2014 219 784.8, DE 10 2014 219 782.1 and DE 10 2014 219 779.1, which concern variations relating to the time at which the control signals defining the setting parameters are determined and to the variables to be included in the optimization.

Problems still exist, however, when combining such dynamic adjustments, i.e. using setting parameters that vary while the measurement sequence is in progress, with static adjustments, i.e. of setting parameters that do not change while the sequence is running, and in particular when there is interaction between the statically adjusted and the dynamically adjusted setting parameters.

Although dynamic adjustments normally facilitate better image quality, it can still be practical, depending on the measurement situation, to adjust setting parameters statically. For instance this makes sense if dynamic adjustments to certain setting parameters require the acquisition of base data, for example B0 maps or B1 maps, and the time needed for this is not available. Other instances are when there are no dynamic switching capabilities available for certain setting parameters (for example with higher-order shim currents for which the power supply only allows slow switching operations) or when the static adjustment data are needed for certain calibration purposes, for example for SAR monitoring.

If static and dynamic adjustments are used simultaneously, dependencies between the setting parameters currently being considered can be a factor, as already mentioned. For example, if static adjustments set new values for the higher-order shim currents for a measurement, previously acquired B0 maps (as base data for a dynamic frequency correction, for instance) are thus no longer valid and must be acquired again. This is explained in more detail using the following practical example.

I. Perform a first measurement using a measurement sequence, which measurement is meant to capture a stack of three-dimensional slices as sub-volumes. The center frequency and the first-order shim settings, i.e. the gradient offset currents as setting parameters, are meant to be optimized dynamically for each slice. For the second-order shim, a static compromise is meant to be set for the entire slice stack, because in the example case, the switching capability is not fast enough for the second-order shim coils.

II. Perform a second measurement using a second measurement sequence, which relates to a different slice geometry, for example to a larger imaging volume or a different slice orientation. Again in this case the center frequency and the offset gradient currents are meant to be dynamically adjusted whereas the setting parameters for the second-order shim are adjusted statically.

The known procedure in the prior art leads in total to the following exemplary, sequence, which is intended to be limited to the steps relevant here.

1) Static frequency adjustment
   a) Measure the resonant frequency in the first slice stack
   b) Determine a static center frequency
   c) Adjust the static center frequency
2) Static shim adjustment
   a) Measure the field homogeneity in the first slice stack
   b) Determine static first-order and second-order shim currents
   c) Adjust the static first-order and second-order shim currents
3) Preparation for dynamic adjustment of center frequency and first-order shim
   a) Measure the absolute field distribution at least in the first slice stack
   b) Determine optimized settings for the center frequency and the first-order shim for each relevant sub-volume for the first measurement using the first measurement sequence, as described in DE 10 2009 020 661 A1 for example.
4) Implementation of the first measurement using dynamic adjustments
5) Static frequency adjustment
   a) Measure the resonant frequency in the second slice stack
   b) Determine a static center frequency
   c) Adjust the static center frequency
6) Static shim adjustment
   a) Determine static first-order and second-order shim currents, with recourse to data from step 2a also being possible if there is no change in position of the patient and/or of the patient table.
   b) Adjust the static shim currents
7) Preparation for dynamic adjustment of center frequency and first-order shim
   a) Measure the absolute frequency distribution in the second slice stack (this measurement is needed because the field distribution changes as a result of steps 5c and 6b)
   b) Determine optimized settings for center frequency and first-order shim for each relevant sub-volume in the second measurement using the second measurement sequence
8) Implementation of the second measurement using dynamic adjustments It should also be noted that step 3b can also be integrated in step 4, which similarly applies to step 7b and step 8.

This example sequence shows that a new measurement of the absolute field distribution as the basis for the dynamic adjustment is needed at the latest after each change in static higher-order shim currents. Such a measurement can take 10 to 60 seconds in the prior art, with the total measurement time increasing significantly accordingly. In fact, however, the data of a relative field distribution can already be considered out of date, and thus necessitating a new measurement, just with the change in the static center frequency in step 5c.

SUMMARY OF THE INVENTION

An object of the invention is to define a procedure that combines such static and dynamic adjustments in a way that is optimum in terms of measurement time.

The method according to the invention is for operating a medical imaging examination apparatus having multiple sub-systems and a controller, which controls the sub-systems in a coordinated manner in order to perform a measurement sequence. In the method, a number of first setting parameters are chosen to be constant for a complete measurement sequence, and after a corresponding static adjustment, for a dynamic adjustment of second setting parameters to be performed. The second setting parameters are defined by control signals for the measurement sequence and can vary while a measurement sequence is being performed. Base data defining underlying conditions specific to the patient to be imaged are measured for the total imaging volume in a measurement sequence, and reference values for the setting parameters that affect the underlying conditions to be measured are saved in association with the base data in the time period of the measurement sequence.

The inventive method further includes the following steps for each measurement using a measurement sequence.

The measurement is started by selecting a measurement protocol to be executed by the controller.

Sequence control data relating to the selected measurement protocol are received by the controller, which data define different functional sub-sequences of the measurement sequence belonging to the measurement protocol.

The controller assigns different effective volumes to each functional sub-sequence.

If the present values of the setting parameters adjusted during the static adjustment differ from the reference values, the controller calculates updated base data on the basis of the difference between the present values and the reference values.

The controller calculate control signals defining the second setting parameters for the measurement sequence on the basis of the transmitted sequence control data, the current base data and the effective volumes, such that the functional sub-sequences of the measurement sequence are optimized locally at least in terms of a sub-region of their assigned effective volume.

The control signals are then used accordingly during implementation of the measurement (scan).

The invention is thus based on the knowledge that for many examinations carried out on patients or on objects to be examined in general, different measurements are performed using different measurement sequences, for example in order to capture different total volumes, to obtain different orientations of slices, to select different contrasts and/or to be able to derive differential diagnoses. Static adjustments often relate to the current acquisition geometry, thus to the total volume to be captured and, if applicable, also to a subdivision of the total volume into the effective volumes. Thus the effective volumes may change when there is a change in the acquisition geometry. If this change then also results in a change to the underlying conditions defined by the base data, the base data would no longer be valid for the subsequent dynamic adjustment. In order to avoid a time-consuming re-measurement, the present invention thus saves the setting for the static adjustments concerned (which temporarily may also relate to second setting parameters), i.e. the reference values for the setting parameters, at the time at which the base data relevant to the dynamic adjustments are determined for the first time. At all subsequent times at which base data relevant to the dynamic adjustments are meant to be determined, the present values of the setting parameters (latest setting for the static adjustment) are thus determined and compared with the settings for the first time the base data were determined, i.e. compared with the reference values, after which the effect of the existing differences on the base data is calculated. The base data can be updated accordingly, and the updated base data can then be used in determining optimized dynamic second setting parameters.

Thus the method according to the invention allows simultaneous use of static and dynamic adjustments without any compromise. The measurement time is reduced by eliminating the need for repeated acquisitions of base data.

The dynamic adjustment itself is well-known from the prior art, as are further embodiments of this dynamic adjustment, any of which can be combined with the invention. Such dynamic adjustments can be implemented as described in DE 10 2009 020 661 A1, DE 10 2014 219 778.3, DE 10 2014 219 785.6, DE 10 2014 219 784.8, DE 10 2014 219 782.1 and DE 10 2014 219 779.1 cited above, the content of which with regard to the dynamic adjustment is incorporated herein by reference. The method according to the invention can also be implemented jointly with the use of condition-dependent adjustment data, cf. DE 10 2014 219 785.6, and also can be applied if effective volumes and/or optimization volumes or underlying conditions change at run time, cf. DE 10 2014 219 782.1 and DE 10 2014 219 784.8. Finally, the method according to the invention can also be used irrespective of whether the second setting parameters are pre-calculated before the start of the measurement (cf. DE 10 2014 219 778.3) or are calculated adaptively during the measurement (cf. DE 10 2014 219 779.1).

The method according to the invention can be used particularly advantageously when a number of measurements using different measurement sequences and different effective volumes and/or total volumes, i.e. different acquisition geometries, are performed on the same patient, and the base data is measured before the first measurement after a static adjustment of the first setting parameters. Thus if a number of measurements follow in succession that are performed in different acquisition geometries and hence require an update to the static adjustment, it is easily possible to derive by calculation the appropriate base data for the dynamic adjustment, because the reference values and the present values for the setting parameters are known. Thus even after successive measurements in different acquisition geometries it is possible to determine optimized control signals without measuring the base data again.

The invention is also based on the knowledge that, especially in modern magnetic resonance apparatuses, there are two groups of setting parameters, with the parameters in each group interacting with each other, and for which there are reasons for adjusting some of the setting parameters of the group concerned statically while the other setting parameters should be adjusted dynamically. Thus, from each group of interacting setting parameters, at least one first setting parameter and at least one second setting parameter are selected, wherein a first group of interacting setting parameters contains the center frequency, first-order shim parameters and higher-order shim parameters, and a second group of interacting setting parameters contains a transmitter scaling parameter and B1 shim parameters. Examples of interacting adjustments in the first group are thus the center-frequency adjustment, the first-order shim adjustment and the higher-order shim adjustment. The first-order shim parameters usually relate to offset currents in the gradient coils, and the higher-order shim parameters relate to shim currents in the relevant field coils (shim coils). Similarly, there is an interaction between the transmitter-scaling adjustment and the B1-shim adjustment. The associated B1 shim parameters are usually given by the amplitudes and phases of RF signals on a number of parallel transmit channels. Furthermore, it should also be noted here that the method according to the invention can be applied both when the center frequency is changed directly by a B0 field coil and when the center frequency is changed indirectly by a suitable frequency shift in the RF transmit and reception system.

The base data can be values of the local basic magnetic field B0 and/or values of the local RF field B1, expressed, for example, in amplitude and phase. Thus, base data constitute information relevant to dynamic adjustments. B0 maps and B1 maps can typically be determined as the base data. It should be noted that B0 maps can be assigned to the first group of interacting setting parameters, and consequently relate to or be determined by the center frequency, first-order shim parameters and higher-order shim parameters. Correspondingly, B1 maps can be assigned to the transmitter scaling parameters and the B1 shim parameters.

According to an exemplary embodiment of the invention, when there is a change in the static adjustment of the center frequency and/or of the first-order or higher-order shim parameters, a B0 field map (forming the base data) is updated by the addition of a difference field defined by the difference in the center frequencies, and by respective addition of difference fields defined by the changed shim parameters together with field changes per unit of current for each shim coil. Alternatively or additionally, when there is a change in a transmitter scaling parameter, which specifies what reference voltage is required at the RF transmit coils on order to generate a predetermined B1 reference field strength, a B1 field map (forming the base data) is updated by scaling with a multiplier that is the ratio of the new reference voltage to the old reference voltage.

The case described first above, which relates to the first group of interacting setting parameters, can be considered in more detail with reference to the example that was presented for the prior art. Based on this example, in step 3a the absolute spatial field distribution B0 (x, y, z) is measured once not only in the slice stack currently being examined but in the total imaging volume, with the result that data exists for any desired slice positions and slice orientations. The static center frequency $F(0)$ set at the time of this measurement and the set static shim currents $S1(0) \ldots Sn(0)$ (of first and possibly higher order) are known as reference values and are saved.

Before determining optimized dynamic adjustments, steps 3b and 7b, the currently set first setting parameters (center frequency $F(i)$, $S1(i) \ldots Sn(i)$) are read and used to determine the differences from the reference values: $\Delta F = F(i) - F(0)$ and respectively $\Delta S1 = S1(i) - S1(0) \ldots \Delta Sn = Sn(i) - Sn(0)$. Since the effect of a change in the center frequency on the spatial field distribution, as well as the effect of a change in the shim current are known, the B0 map (absolute or relative spatial field distribution B0(x,y,z)) can be updated. A change in the center frequency results in an offset given by $\Delta B0(x,y,z) = 2\pi/\gamma \, \Delta F$, where $\gamma$ denotes the gyromagnetic ratio. A change in the shim currents as first-order shim parameters likewise results in a change in the absolute spatial field distribution, because the field changes per unit of current are known:

$$\Delta B0(x,y,z) = S1 * B01(x,y,z) \ldots \Delta B0(x,y,z) = \Delta Sn * B0n(x,y,z),$$

where $B01(x,y,z) \ldots B0n(x,y,z)$ denote the known field changes per unit of current.

The field geometries (field changes) per unit of current generally do not depend on the present subject under examination, and are hence a system-specific parameter that does not need to be determined by patient-dependent adjustment measurements. Thus they are known a priori. These field changes also need to be known for the above-mentioned optimization of the shim currents. They can be determined in the following manner, for example:

As a design value: each channel i of the shim system is generally designed such that per unit of current it generates a change in the B0 field with a certain spatial distribution B0i(x,y,z). This field change can be saved for all instances of a system (for example of a "model type"), hence for all specific examination machines. This can be done in the form of analytical functions, which are adapted to the measured or simulated field distribution, or in the form of a table presenting the simulated or measured spatial distribution. This procedure thus does not take into account the variance between different specific instances of the examination machine.

Alternatively, measurements can also be made for each shim channel of each individual examination machine of a model type, and the spatial field changes B0i(x,y,z) determined for said channels can be saved, as above, either by adapting analytical functions or by using a table. This additionally takes account of the variance between instances.

In the present case, field changes determined in the same manner are used for optimizing the shim parameters (dynamic adjustment) and updating the base data.

Overall, it is thus possible to calculate new, updated base data, i.e. the current relevant spatial field distribution in the form of a B0 map, without a new measurement being needed.

$$B0'(x,y,z) = B0(x,y,z) + 2\pi/\gamma \Delta F + \Delta S1 * B01(x,y,z) + \ldots + \Delta Sn * B0n(x,y,z)$$

Thus this dispenses with re-measuring the absolute field distribution for the preparation for dynamic adjustments in the second measurement. The same applies to every subsequent measurement, so that in total a significant reduction in the total measurement time can be achieved.

A specific example shall likewise be described with regard to the second group of interacting setting parameters. In this second example, in the prior art, B1 maps would need to be repeatedly acquired as base data, whereas this can be avoided in the method according to the invention.

For calibration purposes, in particular for SAR examinations, a static adjustment of the transmitter scaling is often performed, which specifies what RF reference voltage is needed to generate a defined B1 reference field strength. The center of the total volume to be imaged can be used, for example, as the reference volume. Normally the RF pulses are initially pre-calculated with respect to this reference voltage. B1 maps are then acquired using this reference value, and provide for each position (x,y,z) a factor C(x,y,z) by which the B1 field strengths are locally higher or lower than the reference field strength. When dynamic adjustments are applied, the mean factor C is now determined inside the currently relevant effective volume, for example in an imaging slice, and the voltage of the RF pulse calculated accordingly using the locally optimized reference voltage U=Uref/C. If the reference voltage Uref now changes to Uref', for example because another reference volume is assigned or because the static B1 shim setting changes, the previously determined factors C(x,y,z) can no longer be used because the B1 map was acquired using the "old" reference voltage. Thus in the prior art, the B1 map needs to be acquired again as the base data in order to re-establish a consistent data base.

In contrast, in the method according to the invention, the reference voltage that was used to acquire the first B1 map is known as the reference value. The effect of a changed reference voltage on the B1 map, or more precisely on the factors C(x,y,z) determined on this basis, can thus be taken into account directly, with simple scaling of the B1 map by the additional factor Uref/Uref being performed in the case described here without the need to re-measure a B1 map.

A special case is also encompassed by the present invention. The usual case is that measurements for determining setting parameters for static adjustments, i.e. first setting parameters, are only performed when a result from previous measurements of the identical acquisition geometry are not yet available ("adjustment memory"). There are cases, however, in which these measurements are deliberately repeated. This is specifically the case when it is assumed that the ambient conditions of the examination machine have changed over time. For instance thermal effects can result in a change in the center frequency within a specific total volume to be measured during an examination. A subsequent examination using the identical total volume can now specifically request a fresh static adjustment of the center frequency in order to correct this frequency offset.

As part of the present invention, it is now important that in such a case, the change in the center frequency between the two measurements is not included in the update of the relevant base data, in this case a B0 map, if the B0 map relates anyway to an adjustment performed with regard to the ambient conditions, i.e. is specified relative to such a drift-based reference. Otherwise, the static correction to the frequency drift is at least partially reversed by the subsequent dynamic adjustment. Thus it is important to distinguish whether a static adjustment is performed in order to correct changes in the ambient conditions, or whether setting parameters are selected for a new acquisition geometry, in particular a new total volume.

Thus, in an embodiment of the present invention, when values of the base data are given relative to a static adjustment performed for a drift over time, a component of the change in the setting parameters, which is not caused by a change in the individual effective volumes and/or in the total volume, is omitted from the updating of the base data. Specifically in order to determine the change component to be omitted, the static adjustment implemented before a further measurement is performed in two steps. In a first step a re-adjustment is performed for the total volume that forms the basis for the static adjustment when measuring the base data, the result of which is the change component to be omitted. Thereafter, in a second step, static adjustment is performed for the current total volume. Therefore if a static adjustment is performed multiple times for the identical examination geometry, it can be assumed that changes in the ambient conditions, i.e. a drift, are meant to be corrected. Thus it is advantageous in the event of a change in the examination geometry to initially perform another (fast) static adjustment for the examination geometry when acquiring the base data, in order to capture drift effects initially, and only afterwards to perform the static adjustment for the new examination geometry. The two components (drift effects and geometry effects) thus can be implemented distinctly separately, and the base data are updated correctly.

A medical imaging examination apparatus according to the invention has multiple sub-systems and a computerized controller designed to perform the method according to the invention. The controller is designed to control the sub-systems in a coordinated manner in order to perform a measurement sequence on the basis of sequence control data, wherein the sequence control data defines different functional sub-sequences of the measurement sequence, which are assigned different effective volumes.

A non-transitory, electronically readable data storage medium according to the invention is encoded with electronically readable programming instructions (program code) that causes a computer in which the storage medium is loaded to perform the method according to the invention when the programming instructions are executed by the controller of a medical imaging examination apparatus.

The advantages and embodiments described with regard to the method apply analogously to the medical imaging examination apparatus and to the electronically readable data storage medium.

DESCRIPTION OF THE PREFERRED EMBODIMENTS

Figure 1:
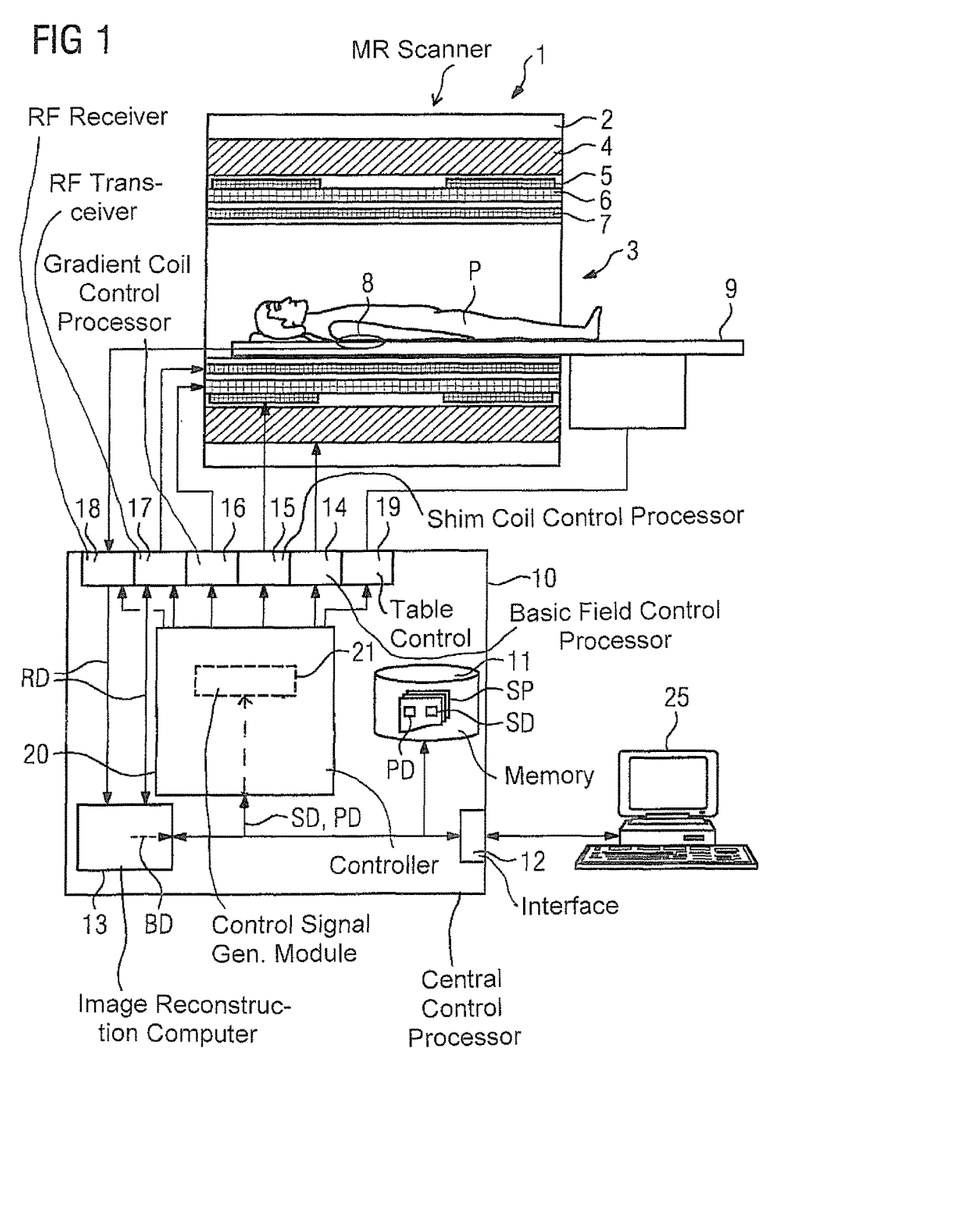
FIG. 1 is a schematic illustration of a known medical imaging examination apparatus, in the form of a magnetic resonance apparatus.

FIG. 1 is a block diagram of a medical imaging examination apparatus, in this case in the form of a magnetic resonance apparatus 1, that includes the actual magnetic resonance scanner 2 containing therein an examination space 3 or patient tunnel. A table 9 can be moved into this patient tunnel 3 into various positions, so that a subject under examination lying on the table 9, e.g. a patient P or person under examination lying thereon, can be supported during an examination in a specific position inside the magnetic resonance scanner 2 relative to the magnet system and RF system arranged therein, and can also be moved between different positions during a measurement. The exact design of the magnetic resonance scanner 2 is not important. For instance, a cylindrical system having a typical patient tunnel can be used, but also a C-arm magnetic resonance apparatus that is open on one side can be used.

Basic components of the magnetic resonance scanner 2 are a basic field magnet 4, a number of shim coils 5, gradient coils 6, and an RF whole-body coil 7. Magnetic resonance signals induced in the subject under examination can be received via the whole-body coil 7, which is normally also used to emit the RF signals for inducing the magnetic resonance signals. It is also possible, however, to receive these signals using local coils 8 placed on or under the patient. All these components are generally known to those skilled in the art and are therefore only shown schematically in FIG. 1.

Signal acquisition, i.e. in general the measurement, is in principle possible in a region of the scanner 2 known as the homogeneity volume, which thus forms the total imaging volume of the magnetic resonance apparatus 1.

The individual components are controlled by a controller 10, here shown in the form of a common block. The controller 10 may be a control computer, which can be formed by a number of individual processors, which may be spatially separate and interconnected via suitable cables or the like. This controller 10 is connected via a terminal interface 12 to a terminal 25, via which an operator can control the entire apparatus 1. A terminal interface 12 is understood to mean here any connection to the controller 10 of input devices such as a mouse and/or keyboard, for instance, and of display devices such as a screen or monitor, for instance, of the terminal 25.

This controller 10 has, inter alia, a basic magnetic field control processor 14, which, for example, monitors the cooling of the basic magnetic field, a shim-coil control processor 15, and a gradient coil control processor 16. An RF transceiver 17 is used to control and obtain readings from the whole-body coil 7. The RF transmitter part of the RF transceiver 17 includes, for example, an RF pulse amplifier for amplifying and shaping the RF pulses, and an NCO, which can be used to set the frequency and phase of the RF pulses. An additional RF receiver 18 is used to obtain readings from any local coils 8 that may be used. This RF receiver 18 can include, for example, a coil selector in order to select, from a number of available local coils, the local coil suitable for the particular examination, and an NCO for setting the frequency and phase. A table control 19 is used for controlling the table 9.

The basic field magnet 4 together with its control processor 14 forms a basic magnetic field system. The shim coils 5 with the associated control processor 15 form a shim system. The magnetic field gradient coils 6 with the associated control processor 16 form a gradient system. The RF whole-body coil 7 with its RF transceiver 17 forms an RF transceiver system. The local coils 8 together with their RF receiver 18 form an RF reception system.

All the control processors 14, 15, 16, 19 and the RF transceivers 17, 18 are controlled in a coordinated manner by a central control processor 20, so that the basic magnetic field, gradient fields and RF pulses needed for performing a measurement are produced in a synchronized manner, the shim coils are adjusted correctly, and the table 9 is in the correct position. It is also necessary to ensure that at the right point in time, the RF receiver 18 reads out and processes appropriately the signals at the local coils 8, and, if necessary, the transceiver 17 reads out and processes appropriately signals at the whole-body coil 7.

The signals or raw data RD acquired in this manner are then routed to an image reconstruction computer 13 in which the desired magnetic resonance image data or spectroscopy data BD can be reconstructed, such as in order then to present such data on the screen of the terminal 25, or to save the data in a memory 11.

The magnetic resonance scanner 2 and the associated controller 10 also have or may have multiple further components that are not described herein in detail. For example, the examination apparatus 1 may also be coupled via a suitable interface to a network, for instance to a radiological information system (RIS), in order to receive via this interface control protocols that can be used in the apparatus 1, or, for instance, in order for magnetic resonance images produced by the apparatus 1 to be sent out, saved in external bulk storage devices, or transferred to diagnosis centers or printers or the like.

The generation by the central control processor 20 of the control signals for the individual control processors 14, 15, 16, 19 and for the RF transceivers 17, 18, at least some of which define setting parameters, is performed in this case by a control-signal generation module 21, which is implemented in the form of software in a processor of the controller 10, and that generates the control signals on the basis of sequence control data SD, which define the various sub-sequences of the complete measurement sequence. This sequence control data SD are usually specified in control protocols SP, which characterize the measurement protocol for the measurement to be performed and can be stored in a memory 11 in the examination apparatus 1. Such a control protocol SP contains all the control data needed for a specific measurement sequence to run smoothly. For example, the operator can use the terminal 25 to select, via a suitable user interface, such a control protocol SP for a measurement to be performed, and then cause the measurement to run fully automatically on the basis of this control protocol SP. It is also possible, however, for the operator to open and modify a control protocol SP, for instance in order to perform specific measurements. It is also possible to select control protocols SP via another network interface (not shown) on other computers, in particular to select from control protocols provided by the manufacturer of the magnetic resonance apparatus or by special service providers involved in developing control protocols.

As explained in detail above, in order to achieve the best possible image quality, it is advisable to control the individual sub-systems for a specific sub-sequence such that they are optimized for the effective volume that is the basis of the specific sub-sequence, or for a specific part thereof. This is done here as part of a dynamic adjustment, as described in the documents cited above.

The controller 10 is designed (configured) to perform the method according to the invention. The method described herein can also exist in the form of a computer program, which implements the method in the controller 10 when it is executed in the controller 10. Such a program can be encoded on an electronically readable data storage medium as electronically readable control information that cause the controller 10 to perform the method according to the invention.

Figure 2:
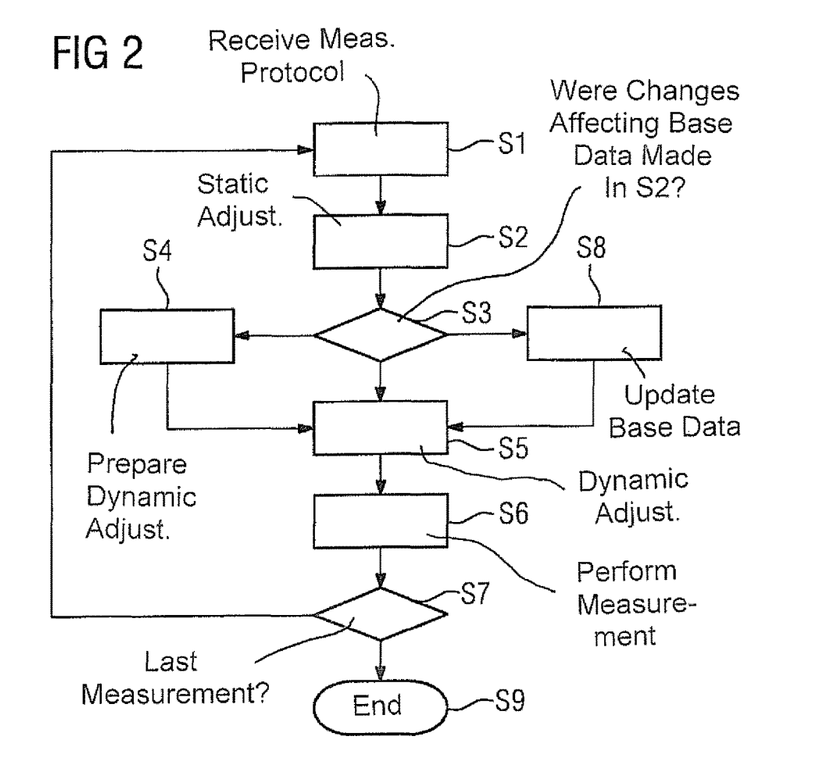
FIG. 2 is a flowchart of an exemplary embodiment of the method according to the invention.

FIG. 2 shows the execution of a method according to the invention for operating a medical imaging examination apparatus 1 having a number of sub-systems and a controller 10, which controls the sub-systems in a coordinated manner in order to perform measurement sequences. In the method, an examination on a patient P is to be performed by a number of measurements using different measurement sequences and in particular different acquisition geometries. In the present exemplary embodiment, the center frequency and the first-order shim parameters are to be adjusted dynamically for a particular acquisition geometry as the second setting parameters, whereas second-order shim parameters are to be adjusted statically as first setting parameters. Similarly, a transmitter scaling parameter is to be adjusted statically, and B1 shim parameters (amplitudes and phases of the RF signals of a multi-channel transmit system) likewise adjusted dynamically.

In a step S1, the measurement protocol for the first measurement is received, which protocol also defines the acquisition geometry to be captured, in particular the total volume that can be subdivided into different effective volumes. The measurement protocols for the different measurements can be preset, can be defined by a user before the examination starts, and/or can be specifically selected by a person performing the examination, after a measurement.

The static adjustment for the measurement protocol with respect to the acquisition geometry then takes place in step S2. This involves first measuring, for the static adjustment of the center frequency, the resonant frequency in the total volume, determining a static center frequency therefrom and setting this static center frequency. This is followed in the static shim adjustment by measuring the field homogeneity in the total volume, determining static first-order and second-order shim parameters, namely shim currents in each case, and setting said shim parameters. In a corresponding manner, a transmitter scaling parameter is determined and set, in this case directly as a reference voltage, for a reference volume in the center of the total volume.

After completion of the static adjustments in step S2, a check is performed in a step S3 as to whether base data already exists for the dynamic adjustment, and if so, whether the static adjustment in step S2 introduced any relevant changes. For the first measurement, base data is normally not available yet for the current patient P, and therefore the preparation for the dynamic adjustment takes place in a step S4. For this purpose, a B0 map (absolute field distribution in the total imaging volume), which is used as the base data for the dynamic adjustment of the center frequency and of the first-order shim parameters, and a B1 field map are measured, in each case in the total imaging volume, with the B1 map being needed as the base data for the dynamic adjustment of the B1 shim parameters. It is important here that the measurement is not confined to the total volume of the first measurement but is performed for the total imaging volume, i.e. for all possible slice orientations and slice positions.

In addition to measuring the B0 map and the B1 map, the present values of the setting parameters statically adjusted in step S2 for performing the measurement, i.e. in the present case the center frequency and the first-order and second-order shim parameters and the reference voltage, are saved as reference values in step S4.

In a step S5, as is generally known, the dynamic adjustment can then be performed, in this case by calculating the control signals defining the center frequency, the first-order shim parameters and the B1 shim parameters for the measurement sequence on the basis of the sequence control data relevant to the selected measurement protocol, the base data measured in step S4 and the effective volumes in such a way that the functional sub-sequences of the measurement sequence are optimized locally at least in terms of a sub-region of their assigned effective volume.

The first measurement is then performed in step S6 using these control signals, and in step S7 a check is made as to whether the last measurement has already taken place. Since, as already explained, this is not possible in the present exemplary embodiment after the first measurement, the method resumes in step S1 with receiving sequence control data relevant to the (next) selected measurement protocol, which data defines different functional sub-sequences of the measurement sequence belonging to the measurement protocol of the next measurement, whereby the acquisition geometry is also known, in particular the allocation of different effective volumes to each functional sub-sequence.

If the acquisition geometry differs with respect to the first measurement, the static adjustment in step S2 will result in modified values for the setting parameters. This is then ascertained in step S3. Thus if a difference between the reference values and the present values of the setting parameters is ascertained in step S3, the method proceeds to step S8, in which the base data is updated, as shall be explained in greater detail below. If, however, there is no difference between the reference values and the present values of the setting parameters for the static adjustment, the method can also continue directly with step S5 because the base data are then still valid.

In step S8, updated base data is calculated on the basis of the reference values and the present values of the setting parameters from the static adjustment in step S2. Since the field changes per unit of current for the various shim coils do not depend on the present subject under examination and are known for the specific system a priori, an updated B0 map can be calculated, as described above, using the formula $$B0'(x,y,z)=B0(x,y,z)+2\pi/\gamma\Delta F+\Delta S1*B01(x,y,z)+\ldots+\Delta Sn*B0n(x,y,z)$$

If the reference voltage has also changed, the B1 map is updated by scaling with a scaling factor Uref'/Uref. Updated base data that is valid for the current setting parameters can thus be determined easily without a re-measurement.

After such an update, the control signals are determined in step S5, on the basis of the updated base data.

If it is established in step S7 that the last measurement has been carried out, the method ends in step S9.

It should also be noted that at least B0 field maps are often referred to a current resonant frequency in the total imaging volume. This can change, however, as a result of drift, for instance caused by thermal effects. Thus if the static adjustment is adapted on the basis of such a total drift, this change component arising from the relative shift in the B0 map must be omitted from the base data update in step S8, which is why a development of the method depicted in FIG. 2 provides that two sub-steps are performed for the static adjustment in step S2, wherein in a first sub-step, a re-adjustment is performed for the total volume on which the static adjustment is based when measuring the base data, the result of which is the change component to be omitted. In this case, the same setting parameters as before should be used in order to establish comparability. For example, when repeating the static frequency adjustment, the same shim currents should be set as for the previous frequency adjustment in the same total volume. In a second step, the measurement is statically adjusted for the current total volume. The change component that is meant to be included is thus obtained easily, because there is a clear distinction between the drift effects and the geometry effects. As has been explained, this mainly relates to the setting parameters for the center frequency.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for operating medical imaging scanner comprising a plurality of scanner hardware sub-systems, said method comprising:

using a controller of the scanner in order to operate the hardware sub-systems in coordination with each other, by providing the respective hardware sub-systems with respective setting parameters from the controller that define respective functions performed by the respective hardware sub-systems, in order to execute a plurality of successive repetitions of a measurement sequence so as to acquire image data from an imaging volume of a subject situated in the scanner, with image data in each repetition of the measurement sequence being acquired only from a respective sub-volume of said imaging volume, with said sub-volumes being different from repetition-to-repetition of the measurement sequence;

in a computer, selecting first setting parameters, among said setting parameters, that are to be constant during each repetition of said measurement sequence, and implementing a static adjustment of said first setting parameters in which each first setting parameter is set to a constant value that will not change during a respective repetition of the measurement sequence;

in said computer, selecting second setting parameters, among said setting parameters, that can vary during each repetition of said measurement sequence and that will be dynamically adjusted during each repetition of said measurement sequence;

with said computer, before starting a first repetition of said measurement sequence, operating the scanner so as to measure base data that are to be used by said controller to dynamically adjust said second setting parameters, said base data being dependent on the constant values of the first setting parameters, and storing said base data in a memory for a duration of said first repetition of said measurement sequence, associated with reference values that designate the constant values of the first setting parameters that existed when the base data were measured;

from said computer, providing control signals to said controller in order to operate said scanner with said controller so as to execute said first repetition of said measurement sequence with said first setting parameters at said constant values and with dynamic adjustment of said second setting parameters by said controller according to said base data stored in said memory;

before each subsequent repetition of said measurement sequence, repeating said static adjustment of said first setting parameters in said computer so as to set said first setting parameters to updated constant values, and thereby changing at least one of said reference values in said memory;

in said computer, also updating said base data in said memory, before each subsequent repetition of said measurement sequence, dependent on said at least one changed reference value, thereby producing updated base data, and retaining said updated base data in said memory during the respective subsequent repetition of said measurement sequence for which the updated base data were produced;

from said computer, providing further control signals to said controller in order to operate said scanner with said controller so as to execute each subsequent repetition of said measurement sequence, with said updated first setting parameters and with dynamic adjustment of said second setting parameters according to the updated base data in the memory, until image data have been acquired from all of said sub-volumes; and in said computer, making the image data acquired from said sub-volumes available in electronic form as a datafile comprising image data for an entirety of said image volume.

2. A method as claimed in claim 1 wherein measuring said base data comprises:
operating said scanner in order to obtain respective sets of base data individually for each of a plurality of different measurement sequences, or a plurality of different effective volumes, or a plurality of different total volumes.

3. A method as claimed in claim 1 comprising:
selecting said first setting parameters from the group consisting of center frequency, first-order shim parameters, and higher-order shim parameters;
selecting said second setting parameters from the group consisting of a transmitter scaling parameter and B1 shim parameters.

4. A method as claimed in claim 3 wherein said base data represent values of at least one of a basic magnetic (B0) field in said scanner, and a local radio frequency field in said scanner.

5. A method as claimed in claim 4 wherein said change occurs in the static setting of at least one of said center frequency and one of said shim parameters, and calculating a B0 field map as said base data, updated by addition of a difference field defined by a difference in said center frequency and by addition of difference fields defined by the changed shim parameters together with field changes per unit of current for each shim coil.

6. A method as claimed in claim 4 comprising, when said at least one reference value in said memory that is changed by updating said first setting parameters, omitting any updating to said B0 field represented in said base data in said memory.

7. A method as claimed in claim 3 wherein said change is a change of said transmitter scaling parameter that specifies a reference voltage required for RF transmit coils of the data acquisition scanner in order to generate a predetermined B1 reference field of strength, and calculating a B1 field map as said base data updated by scaling a ratio of a current reference voltage to a reference voltage in said reference values.

8. A medical imaging apparatus comprising:
a medical imaging scanner comprising a plurality of scanner hardware sub-systems;
a controller of the scanner configured to operate the hardware sub-systems in coordination with each other, by providing the respective hardware sub-systems with respective setting parameters from the controller that define respective functions performed by the respective hardware sub-systems, in order to execute a plurality of successive repetitions of a measurement sequence so as to acquire image data from an imaging volume of a subject situated in the scanner, with image data in each repetition of the measurement sequence being acquired only from a respective sub-volume of said imaging volume, with said sub-volumes being different from repetition-to-repetition of the measurement sequence;
a computer configured to select first setting parameters, among said setting parameters, that are to be constant during each repetition of said measurement sequence, and to implement a static adjustment of said first setting parameters in which each first setting parameter is set to a constant value that will not change during a respective repetition of the measurement sequence;
said computer being configured to select second setting parameters, among said setting parameters, that can vary during each repetition of said measurement sequence and that will be dynamically adjusted during each repetition of said measurement sequence;
said computer being configured to operate the scanner, before starting a first repetition of said measurement sequence, so as to measure base data that are to be used by said controller to dynamically adjust said setting parameters, said base data being dependent on the constant values of the first setting parameters, and to store said base data in a memory for a duration of said first repetition of said measurement sequence, associated with reference values that designate the constant values of the first setting parameters that existed when the base data were measured;
said computer being configured to provide control signals to said controller in order to operate said scanner with said controller so as to execute said first repetition of said measurement sequence with said first setting parameters at said constant values and with dynamic adjustment of said second setting parameters by said controller according to said base data stored in said memory;
said computer being configured to repeat, before each subsequent repetition of said measurement sequence, said static adjustment of said first setting parameters so as to set said first setting parameters to updated constant values, and thereby changing at least one of said reference values in said memory;

said computer being configured to also update said base data in said memory, before each subsequent repetition of said measurement sequence, dependent on said at least one changed reference value, thereby produce updated base data, and to retain said updated base data in said memory during the respective subsequent repetition of said measurement sequence for which the updated base data were produced;

said computer being configured to provide further control signals to said controller in order to operate said scanner with said controller so as to execute each subsequent repetition of said measurement sequence, with said updated first setting parameters and with dynamic adjustment of said second setting parameters according to the updated base data in the memory, until image data have been acquired from all of said sub-volumes; and said computer being configured to make the image data acquired from said sub-volumes available in electronic form as a datafile comprising image data for an entirety of said image volume.

9. A non-transitory, computer-readable data storage medium encoded with programming instructions, said storage medium being loaded into a computer and a controller of a medical imaging apparatus that comprises a medical imaging scanner, comprising a plurality of scanner hardware sub-systems, said programming instructions causing said computer and said controller to:

with said controller, operate the hardware sub-systems in coordination with each other, by providing the respective hardware sub-systems with respective setting parameters from the controller that define respective functions performed by the respective hardware sub-systems, in order to execute a plurality of successive repetitions of a measurement sequence so as to acquire image data from an imaging volume of a subject situated in the scanner, with image data in each repetition of the measurement sequence being acquired only from a respective sub-volume of said imaging volume, with said sub-volumes being different from repetition-to-repetition of the measurement sequence;

with said computer, select first setting parameters, among said setting parameters, that are to be constant during each repetition of said measurement sequence, and implement a static adjustment of said first setting parameters in which each first setting parameter is set to a constant value that will not change during a respective repetition of the measurement sequence;

with said computer, select second setting parameters, among said setting parameters, that can vary during each repetition of said measurement sequence and that will be dynamically adjusted during each repetition of said measurement sequence;

with said computer, before starting a first repetition of said measurement sequence, operate the scanner so as to measure base data that are to be used by said controller to dynamically adjust said setting parameters, said base data being dependent on the constant values of the first setting parameters, and store said base data in a memory for a duration of said first repetition of said measurement sequence, associated with reference values that designate the constant values of the first setting parameters that existed when the base data were measured;

with said computer, provide control signals to said controller in order to operate said scanner with said controller so as to execute said first repetition of said measurement sequence with said first setting parameters at said constant values and with dynamic adjustment of said second setting parameters by said controller according to said base data stored in said memory;

with said computer, before each subsequent repetition of said measurement sequence, repeat said static adjustment of said first setting parameters so as to set said first setting parameters to updated constant values, and thereby change at least one of said reference values in said memory;

with said computer, also update said base data in said memory, before each subsequent repetition of said measurement sequence, dependent on said at least one changed reference value, and thereby produce updated base data, and retain said updated base data in said memory during the respective subsequent repetition of said measurement sequence for which the updated base data were produced;

with said computer, provide further control signals to said controller in order to operate said scanner with said controller so as to execute each subsequent repetition of said measurement sequence, with said updated first setting parameters and with dynamic adjustment of said second setting parameters according to the updated base data in the memory, until image data have been acquired from all of said sub-volumes; and with said computer, make the image data acquired from said sub-volumes available in electronic form as a datafile comprising image data for an entirety of said image volume.

* * * * *